(12) United States Patent
Kim et al.

(10) Patent No.: US 11,950,379 B2
(45) Date of Patent: Apr. 2, 2024

(54) DISPLAY DEVICE HAVING SUPPORT LAYERS

(71) Applicant: Samsung Display Co., Ltd., Yongin-si (KR)

(72) Inventors: Min-Sung Kim, Hwaseong-si (KR); Jungil Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/447,747

(22) Filed: Sep. 15, 2021

(65) Prior Publication Data
US 2022/0174823 A1 Jun. 2, 2022

(30) Foreign Application Priority Data

Dec. 2, 2020 (KR) ........................ 10-2020-0166213

(51) Int. Cl.
*H05K 5/03* (2006.01)
*G06F 1/16* (2006.01)
*H05K 5/00* (2006.01)

(52) U.S. Cl.
CPC ......... *H05K 5/0017* (2013.01); *G06F 1/1652* (2013.01); *H05K 5/03* (2013.01)

(58) Field of Classification Search
CPC ...... G06F 1/1652; H05K 5/03; H05K 5/0226; H04M 1/0268
See application file for complete search history.

(56) References Cited

U.S. PATENT DOCUMENTS

| | | | |
|---|---|---|---|
| 9,069,521 B2* | 6/2015 | Lee | ........................... G06F 1/16 |
| 9,772,656 B2* | 9/2017 | Chong | ................. G09G 3/3225 |

(Continued)

FOREIGN PATENT DOCUMENTS

| | | |
|---|---|---|
| CN | 106856206 B | 6/2020 |
| KR | 10-2017-0021431 A | 2/2017 |

(Continued)

OTHER PUBLICATIONS

International Search Report for corresponding International Application No. PCT/KR2021/015166, dated Jan. 28, 2022 (3 pages).

*Primary Examiner* — Rockshana D Chowdhury
*Assistant Examiner* — Douglas R Burtner
(74) *Attorney, Agent, or Firm* — Lewis Roca Rothgerber Christie LLP

(57) ABSTRACT

A display panel comprises a first non-folding area, a second non-folding area, and a folding area between the first non-folding area and the second non-folding area; and a lower member under the display panel, the lower member comprising: a first support layer comprising a first support portion and a first protective portion extending from the first support portion, and having an elastic modulus smaller than the first support portion; a second support layer comprising a second support portion and a second protective portion extending from the second support portion, and having an elastic modulus smaller than the second support portion and spaced apart from the first support layer; and a cover layer under the first support layer and the second support layer, coupled with the first support layer and the second support layer, and corresponding to the first non-folding area, the second non-folding area, and the folding area.

17 Claims, 14 Drawing Sheets

(56) References Cited

U.S. PATENT DOCUMENTS

| | | | |
|---|---|---|---|
| 9,983,424 B2* | 5/2018 | Kim | G06F 1/1624 |
| 10,069,107 B2 | 9/2018 | Jeon | |
| 10,198,041 B2* | 2/2019 | Myeong | G06F 1/1652 |
| 10,367,173 B1* | 7/2019 | Wu | H04M 1/0268 |
| 10,383,239 B2* | 8/2019 | Lee | H05K 5/0017 |
| 10,691,175 B2 | 6/2020 | Lee | |
| 10,755,991 B2* | 8/2020 | Park | B32B 7/12 |
| 10,910,589 B2* | 2/2021 | Jeong | H01L 51/5237 |
| 10,930,883 B2 | 2/2021 | Park | |
| 11,175,693 B2* | 11/2021 | Song | G09G 3/3208 |
| 11,204,627 B2* | 12/2021 | Park | H04M 1/0268 |
| 11,296,286 B2* | 4/2022 | Seo | G06F 1/1652 |
| 11,395,415 B2* | 7/2022 | Gu | G06F 1/1652 |
| 11,442,202 B2* | 9/2022 | Park | H05K 5/0017 |
| 11,455,005 B2* | 9/2022 | Seo | G06F 1/1681 |
| 11,455,914 B2* | 9/2022 | Yoon | G06F 1/1641 |
| 11,470,734 B2* | 10/2022 | Sim | G06F 1/1641 |
| 11,474,559 B2* | 10/2022 | Kim | G06F 1/1641 |
| 11,489,120 B2* | 11/2022 | Park | H01L 51/0097 |
| 11,528,819 B2* | 12/2022 | Lee | H04M 1/0216 |
| 11,546,986 B2* | 1/2023 | Wang | H05K 1/028 |
| 2016/0357052 A1 | 12/2016 | Kim et al. | |
| 2019/0204867 A1* | 7/2019 | Song | G06F 1/1641 |
| 2020/0047451 A1* | 2/2020 | Dong | B32B 27/365 |
| 2020/0401185 A1* | 12/2020 | Won | B32B 38/0004 |
| 2021/0141418 A1* | 5/2021 | Min | H05K 5/0017 |
| 2021/0165447 A1* | 6/2021 | Wang | G06F 1/1681 |
| 2021/0174711 A1* | 6/2021 | Cho | G06F 1/1652 |
| 2021/0249625 A1* | 8/2021 | Kim | G06F 1/1641 |
| 2021/0287576 A1* | 9/2021 | Park | B32B 17/06 |
| 2022/0113824 A1* | 4/2022 | Kishimoto | H10K 59/40 |
| 2022/0147102 A1* | 5/2022 | Kishimoto | G06F 1/1641 |
| 2022/0159847 A1* | 5/2022 | Ahn | G06F 1/1616 |
| 2022/0236818 A1* | 7/2022 | Oh | G06F 3/0488 |
| 2023/0021348 A1* | 1/2023 | Cho | G09B 9/301 |
| 2023/0034440 A1* | 2/2023 | Xie | G06F 1/1641 |

FOREIGN PATENT DOCUMENTS

| | | |
|---|---|---|
| KR | 10-2019-0003257 A | 1/2019 |
| KR | 10-2019-0050325 A | 5/2019 |
| KR | 10-2019-0081341 A | 7/2019 |
| KR | 10-2019-0082339 A | 7/2019 |
| KR | 10-2019-0124844 A | 11/2019 |
| KR | 10-2020-0019000 A | 2/2020 |

* cited by examiner

DISPLAY DEVICE HAVING SUPPORT LAYERS

CROSS-REFERENCE TO RELATED APPLICATION

The present application claims priority to and the benefit of Korean Patent Application No. 10-2020-0166213, filed on Dec. 2, 2020, the entire content of which is hereby incorporated by reference.

BACKGROUND

1. Field

Aspects of some embodiments of the present disclosure relate to a display device.

2. Description of the Related Art

A display device includes a display area that is activated in response to electrical signals. The display device may sense an input applied thereto from the outside through the display area (e.g., touch input) and may also display images to provide a user with information. In recent years, as display devices of various shapes have been developed, the display areas are being designed to have various shapes. In addition, display devices whose shape is able to be changed are being developed to improve portability for the user and to make better use of residential spaces.

The above information disclosed in this Background section is only for enhancement of understanding of the background and therefore the information discussed in this Background section does not necessarily constitute prior art.

SUMMARY

Aspects of some embodiments of the present disclosure relate to a display device. For example, aspects of some embodiments of the present disclosure relate to a foldable display device.

Aspects of some embodiments of the present disclosure include a foldable display device having relatively improved reliability.

Aspects of some embodiments of the inventive concept include a display device including a display panel including a first non-folding area, a second non-folding area, and a folding area between the first non-folding area and the second non-folding area and a lower member under the display panel. The lower member includes a first support layer including a first support portion corresponding to the first non-folding area and a first protective portion extending from the first support portion, corresponding to the folding area, and having an elastic modulus smaller than the first support portion, a second support layer including a second support portion corresponding to the second non-folding area and a second protective portion extending from the second support portion, corresponding to the folding area, and having an elastic modulus smaller than the second support portion and spaced apart from the first support layer, and a cover layer under the first support layer and the second support layer, coupled with the first support layer and the second support layer, and corresponding to the first non-folding area, the second non-folding area, and the folding area.

According to some embodiments, the first protective portion is provided with a plurality of first openings defined therethrough, and the second protective portion is provided with a plurality of second openings defined therethrough.

According to some embodiments, the first openings are arranged in a grid shape or a lattice shape in a plane, and the second openings are arranged in a grid shape or a lattice shape in a plane.

According to some embodiments, the first protective portion and the second protective portion have an elastic modulus within a range from about 1 GPa to about 30 GPa.

According to some embodiments, the first support portion and the second support portion have an elastic modulus within a range from about 100 GPa to about 200 GPa.

According to some embodiments, the first protective portion and the second protective portion have substantially a same elastic modulus.

According to some embodiments, the first protective portion and the first support portion are provided integrally with each other, and the second protective portion and the second support portion are provided integrally with each other.

According to some embodiments, the first support layer and the second support layer includes SUS or Invar.

According to some embodiments, the first protective portion and the second protective portion are spaced apart from each other by a first distance in an unfolded state of the display device, and the first distance is equal to or smaller than about 0.7 mm.

According to some embodiments, the first protective portion and the second protective portion are spaced apart from each other by a second distance greater than the first distance in a folded state of the display device.

According to some embodiments, the cover layer has a maximum curvature radius (R) with respect to a folding axis when the display device is folded about the folding axis.

According to some embodiments, a sum (W) of a width of the first protective portion and a width of the second protective portion satisfies the following Equation of $W<\pi \times R$.

According to some embodiments, the lower member further includes a first adhesive layer attached to an upper surface of the first support portion and a second adhesive layer attached to an upper surface of the second support portion.

According to some embodiments, the first adhesive layer and the second adhesive layer are spaced apart from each other in a plane.

According to some embodiments, a distance between the first adhesive layer and the second adhesive layer in an unfolded state of the display device corresponds to a width of the folding area.

According to some embodiments, the lower member further includes a cushion layer attached to an upper surface of the first adhesive layer and an upper surface of the second adhesive layer.

According to some embodiments, a distance between the first protective portion and the cushion layer increases as a distance from the first support portion increases in a folded state of the display device.

According to some embodiments, the lower member further includes an adhesive layer attached to the first support portion and the second support portion, and the adhesive layer includes a first area attached to an upper surface of the first support portion, a second area attached to an upper surface of the second support portion, and a third area overlapping an upper surface of the first protective portion and an upper surface of the second protective portion while not being attached to the upper surface of the first protective portion and the upper surface of the second protective portion.

According to some embodiments, the cover layer includes a plastic film.

According to some embodiments, the lower member further includes a panel protective layer between the display panel and the first support layer and between the display panel and the second support layer and a cushion layer between the panel protective layer and the first support layer and between the panel protective layer and the second support layer.

Aspects of some embodiments of the inventive concept include a display device including a display panel including a first non-folding area, a second non-folding area, and a folding area between the first non-folding area and the second non-folding area and a lower member under the display panel. The lower member includes a first support layer including a first support portion corresponding to the first non-folding area and a first protective portion extending from the first support portion, corresponding to the folding area, and having an elastic modulus smaller than the first support portion, a second support layer including a second support portion corresponding to the second non-folding area and a second protective portion extending from the second support portion, corresponding to the folding area, having an elastic modulus smaller than the second support portion, and spaced apart from the first protective portion, an intermediate layer between the display panel and the first support layer and between the display panel and the second support layer, a first adhesive layer attaching the intermediate layer to the first support portion, and a second adhesive layer attaching the intermediate layer to the second support portion and spaced apart from the first adhesive layer in a plane. A distance between the intermediate layer and one end of the first protective portion in a folded state of the display panel is greater than a distance between the intermediate layer and the one end of the first protective portion in an unfolded state of the display panel.

According to some embodiments, the first protective portion is provided with a plurality of first openings defined therethrough, and the second protective portion is provided with a plurality of second openings defined therethrough.

According to some embodiments, the first adhesive layer does not overlap the first protective portion.

According to some embodiments, the first protective portion and the second protective portion are spaced apart from each other in an unfolded state of the display device, and a distance between the first protective portion and the second protective portion is equal to or smaller than about 0.7 mm.

According to some embodiments, a distance between the first protective portion and the second protective portion in the folded state of the display panel is greater than a distance between the first protective portion and the second protective portion in the unfolded state of the display panel.

According to some embodiments, the occurrence of creases caused by the repetitive folding and unfolding operations of the display device may be minimized or reduced.

According to some embodiments, the stress generated when the display device is folded may be reduced by employing the support layer separated into a plurality of portions.

According to some embodiments, the support layer overlapping the folding area has a flexibility such that the cover layer under the support layer is prevented from tearing when the display device is folded.

BRIEF DESCRIPTION OF THE DRAWINGS

The above and other characteristics of some embodiments of the present disclosure will become readily apparent by reference to the following detailed description when considered in conjunction with the accompanying drawings wherein:

FIG. 3B is a plan view showing a portion of FIG. 3A;

DETAILED DESCRIPTION

Figure 1A:
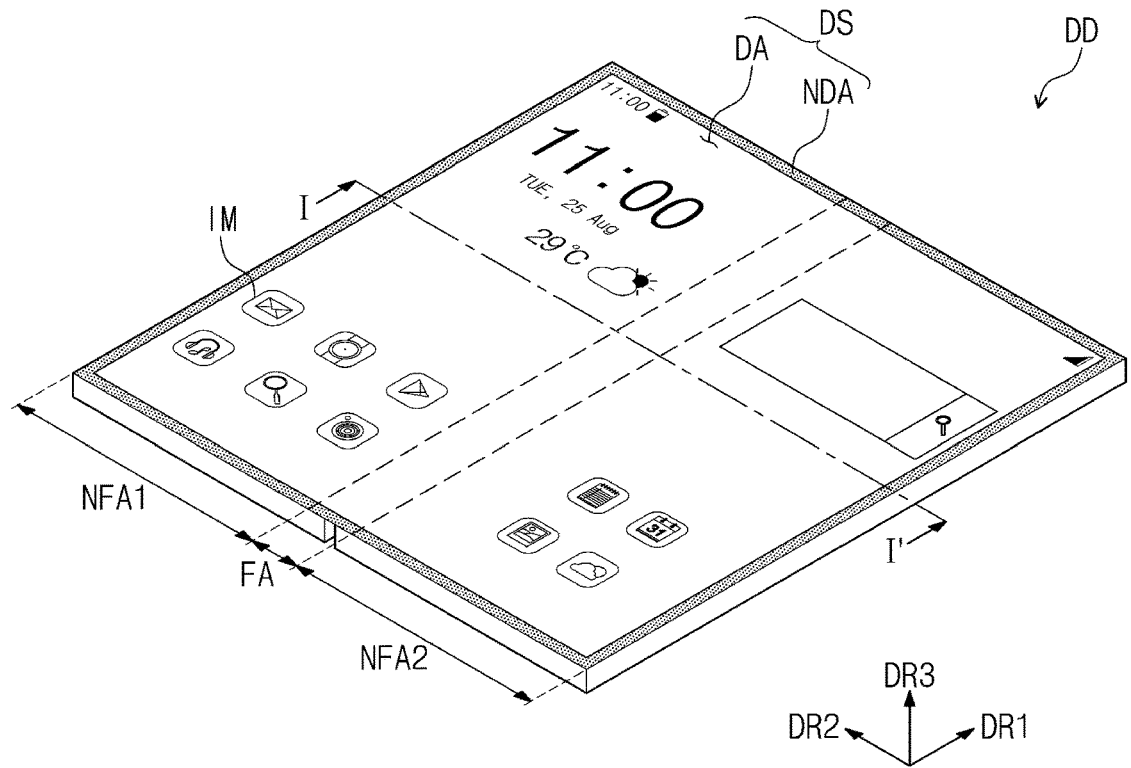
FIGS. 1A and 1B are perspective views showing a display device according to some embodiments of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to accompanying drawings.

Figure 1B:
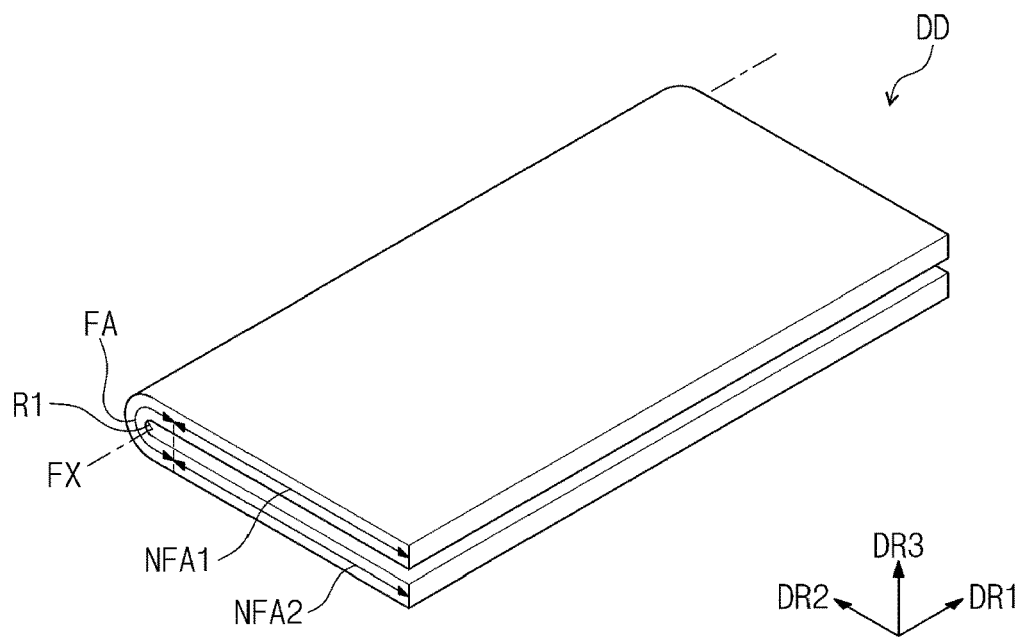

FIGS. 1A and 1B are perspective views showing display devices DD according to some embodiments of the present disclosure. FIG. 1A shows an unfolded state of the display device DD, and FIG. 1B shows a folded state of the display device DD.

Referring to FIGS. 1A and 1B, the display device DD may include a display surface DS defined by a first direction DR1 and a second direction DR2 crossing the first direction DR1. The display device DD may provide an image IM to a user through the display surface DS.

The display surface DS may include a display area DA and a non-display area NDA around the display area DA. The images IM may be displayed through the display area DA and may not be displayed through the non-display area NDA. The non-display area NDA may surround the display area DA. However, it should not be limited thereto or thereby, and a shape of the display area DA and a shape of the non-display area NDA may be changed.

Hereinafter, a direction substantially perpendicular to a plane defined by the first direction DR1 and the second direction DR2 may be referred to as a third direction DR3. In the following descriptions, the expression "when viewed in a plane" or "on a plane" or "in a plan view" means a state of being viewed in the third direction DR3. Hereinafter, the first, second, and third directions DR1, DR2, and DR3 are directions respectively indicated by first, second, and third directional axes. The directions and the directional axes are assigned with the same reference numerals.

The display device DD may include a folding area FA, a first non-folding area NFA1, and a second non-folding area NFA2. When viewed in the second direction DR2, the folding area FA may be arranged between the first non-folding area NFA1 and the second non-folding area NFA2. The open state or unfolded state of the display device DD may be defined as a first mode.

As shown in FIG. 1B, the folding area FA may be folded with respect to a folding axis FX substantially parallel to the first direction DR1. The folding area FA may have a curvature (e.g., a set or predetermined curvature) and a curvature radius (e.g., a set or predetermined curvature radius) R1. The display device DD may be inwardly folded (inner-folding) such that the first non-folding area NFA1 faces the second non-folding area NFA2 and the display surface DS is not exposed to the outside. The folded state of the display device DD may be defined as a second mode.

According to some embodiments, the display device DD may be outwardly folded (outer-folding) such that the display surface DS is exposed to the outside. According to some embodiments, the display device DD may be provided to repeatedly carry out the inner-folding and outer-folding operations from an unfolding operation. According to some embodiments, the display device DD may be provided to repeatedly carry out the unfolding operation and the inner-folding operation or to repeatedly carry out the unfolding operation and the outer-folding operation.

As shown in FIG. 1B, a distance between the first non-folding area NFA1 and the second non-folding area NFA2 may be substantially the same as a distance corresponding to two times of the curvature radius R1, however, it should not be limited thereto or thereby. According to some embodiments, the distance between the first non-folding area NFA1 and the second non-folding area NFA2 may be smaller than the distance corresponding to two times of the curvature radius R1. According to some embodiments, the distance between the first non-folding area NFA1 and the second non-folding area NFA2 may decrease as a distance from the folding area FA increases.

Figure 2A:
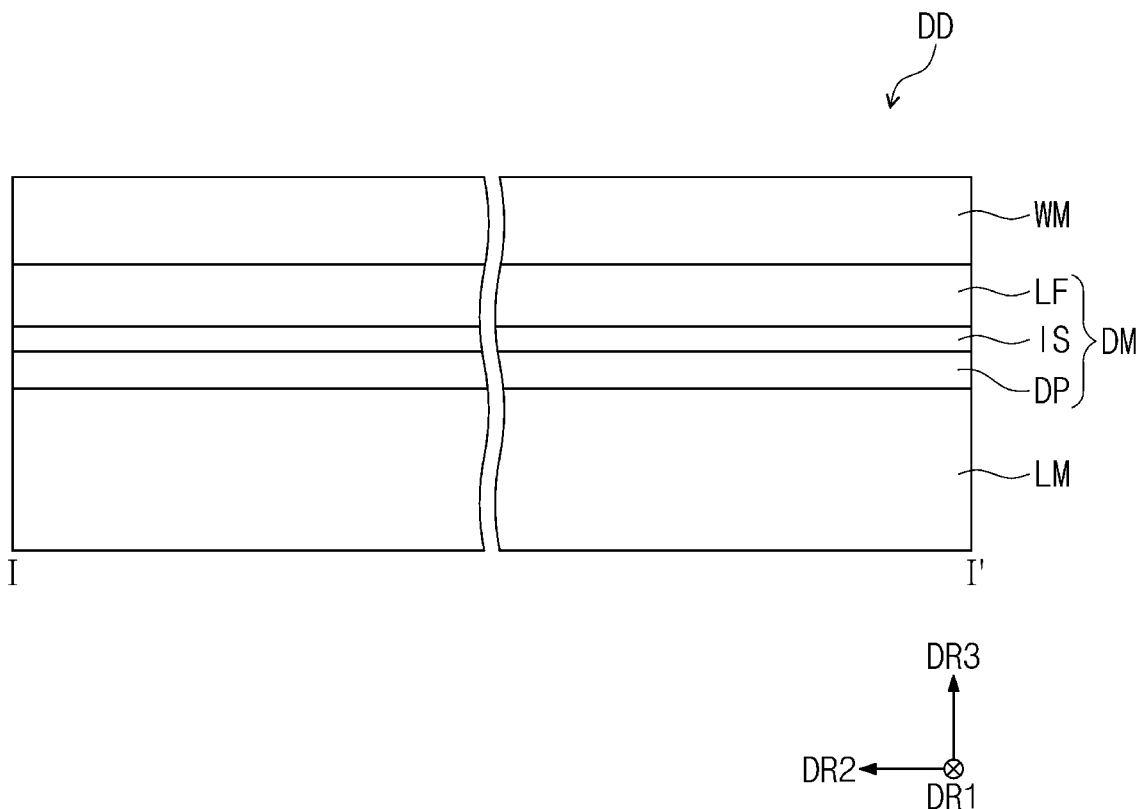
FIG. 2A is a cross-sectional view schematically showing a display device according to some embodiments of the present disclosure.
Figure 2B:
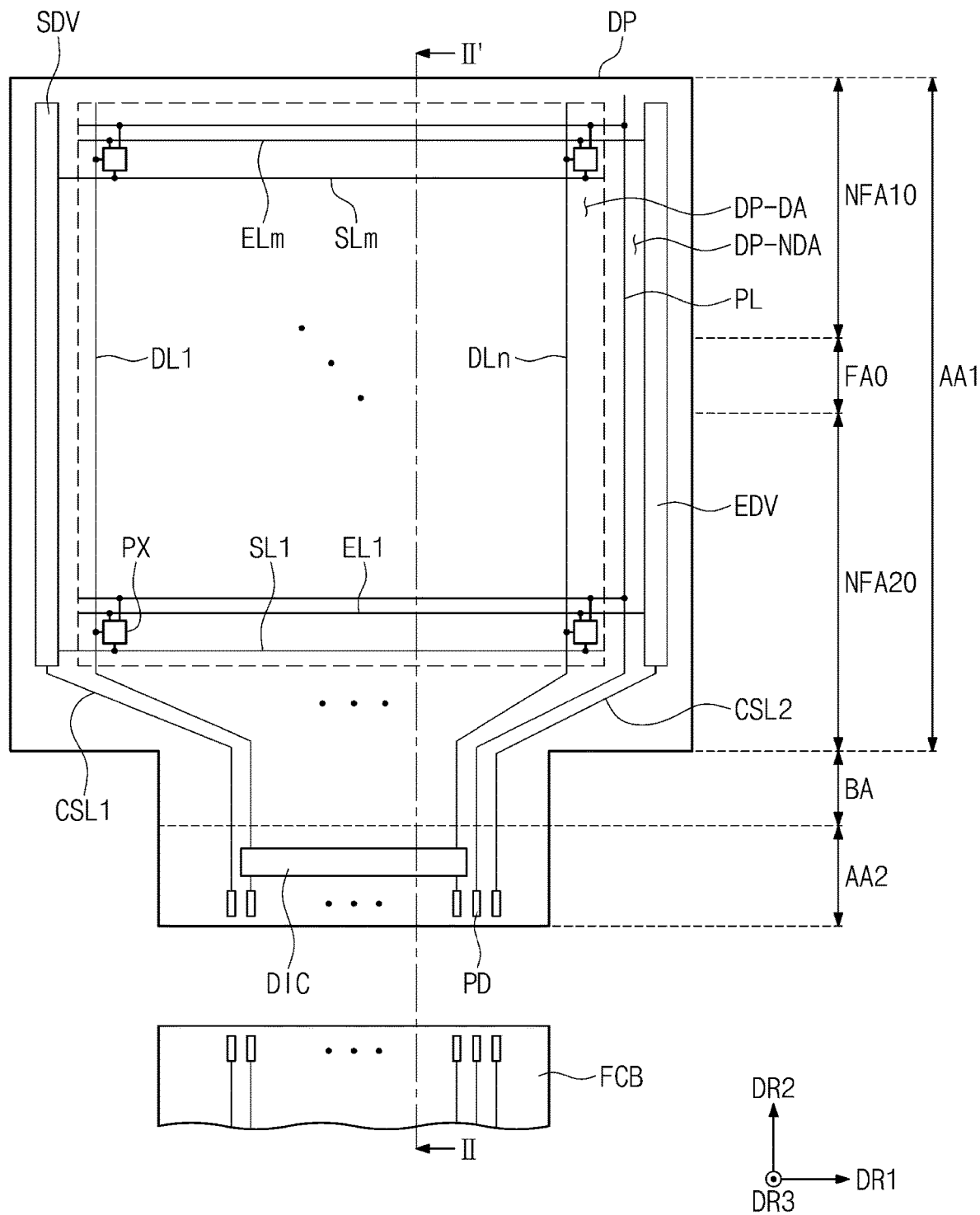
FIG. 2B is a plan view showing a display panel according to some embodiments of the present disclosure.

FIG. 2A is a cross-sectional view schematically showing the display device DD according to some embodiments of the present disclosure, and FIG. 2B is a plan view showing a display panel DP according to some embodiments of the present disclosure. FIG. 2A shows a cross-section taken along a line I-I' of FIG. 1A.

Referring to FIG. 2A, the display device DD may include the display panel DP, an input sensor IS arranged on the display panel DP, an anti-reflective layer LF arranged on the input sensor IS, a window module WM arranged on the anti-reflective layer LF, and a lower member LM arranged under the display panel DP. An adhesive layer may be arranged between the above-mentioned components as needed.

The display panel DP may include a base layer, a circuit element layer located on the base layer, a display element layer located on the circuit element layer, and a thin film encapsulation layer located on the display element layer. The base layer may include a plastic film. For example, the base layer may include polyimide. The base layer may have substantially the same shape as that of the display panel DP shown in FIG. 2B in a plane.

The circuit element layer may include an organic layer, an inorganic layer, a semiconductor pattern, a conductive pattern, and a signal line. The organic layer, the inorganic layer, a semiconductor layer, and a conductive layer may be formed on the base layer by a coating or depositing process. Then, the organic layer, the inorganic layer, the semiconductor layer, and the conductive layer may be selectively patterned through several photolithography processes, and thus, the semiconductor pattern, the conductive pattern, and the signal line may be formed.

The semiconductor pattern, the conductive pattern, and the signal line may form a pixel driving circuit and signal lines SL1 to SLm, DL1 to DLn, EL1 to ELm, CSL1, CSL2, and PL of pixels PX (refer to FIG. 2B) described later. The pixel driving circuit may include at least one transistor.

The display element layer may include an emission element of the pixels PX described later. The emission element may be electrically connected to the at least one transistor. The thin film encapsulation layer may be located on the circuit element layer to encapsulate the display element layer. The thin film encapsulation layer may include an inorganic layer, an organic layer, and an inorganic layer, which are sequentially stacked. The stack structure of the thin film encapsulation layer should not be particularly limited.

The input sensor IS may include a plurality of sensing electrodes to sense an external input (e.g., a touch input), trace lines connected to the sensing electrodes, and an inorganic layer and/or an organic layer to insulate/protect the sensing electrodes or the trace lines. The sensing electrodes may overlap a display area DP-DA (refer to FIG. 2B). The input sensor IS may be a capacitive sensor, however, it should not be limited thereto or thereby.

The input sensor IS may be formed on the thin film encapsulation layer through successive processes when the display panel DP is being manufactured. However, embodiments according to the present disclosure are not be limited thereto or thereby, and the input sensor ISP may be attached to the display panel DP by an adhesive layer after being formed as a separate panel from the display panel DP.

The anti-reflective layer LF may reduce a reflectance of an external light. The anti-reflective layer LF may include a retarder and/or a polarizer. The anti-reflective layer LF may include at least a polarization film. The anti-reflective layer LF may include a color filter and a black matrix. According to some embodiments, the stack structure of the display panel DP, the input sensor IS, and the anti-reflective layer LF may define the display module DM.

The lower member LM may include a variety of functional members. The functional members may include a light blocking layer to block a light incident to the display panel DP, an impact absorbing layer to absorb the external impact, a support layer to support the display panel DP, and a heat dissipation layer to dissipate heat generated by the display panel DP. A stack structure of the lower member LM should not be particularly limited.

Referring to FIG. 2B, the display panel DP may include the display area DP-DA and a non-display area DP-NDA around the display area DP-DA. The display area DP-DA and the non-display area DP-NDA may be classified by the presence or absence of the pixel PX. The pixel PX may be located in the display area DP-DA.

The display panel DP may include the display area DP-DA and the non-display area DP-NDA, which respectively correspond to the display area DA (refer to FIG. 1A) and the non-display area NDA (refer to FIG. 1A) of the display device DD. In the present disclosure, the expression "an area/portion corresponds to another area/portion" means that "an area/portion overlaps another area/portion", however, the "areas and portions" should not be limited to have the same size as each other.

A scan driver SDV, a data driver, and an emission driver EDV may be located in the non-display area DP-NDA. The data driver may be a circuit configured in a driving chip DIC shown in FIG. 2B.

The display panel DP may include a first area AA1, a second area AA2, and a bending area BA, which are distinguished from each other in the second direction DR2. The second area AA2 and the bending area BA may be portions of the non-display area DP-NDA. The bending area BA may be located between the first area AA1 and the second area AA2.

FIG. 2B shows an unfolded state of the display panel DP before the display panel DP is bent. When the display panel DP is installed in an electronic device (e.g., a mobile telephone, a smart phone, a tablet computer, etc.), the first area AA1 and the second area AA2 of the display panel DP may be arranged on different planes from each other in the unfolded state of the display device DD shown in FIG. 1A. This is because the bending area BA is bent to allow the second area AA2 to be located under (e.g., along the third direction DR3) the first area AA1.

The first area AA1 may be an area corresponding to the display surface DS of FIG. 1A. The first area AA1 may include a first non-folding area NFA10, a second non-folding area NFA20, and a folding area FA0. The first non-folding area NFA10, the second non-folding area NFA20, and the folding area FA0 may respectively correspond to the first non-folding area NFA1, the second non-folding area NFA2, and the folding area FA of FIGS. 1A and 1B.

A length in the first direction DR1 of the bending area BA and the second area AA2 may be smaller than a length of the first area AA1. An area where a length in a bending axis direction is short may be relatively easily bent (e.g., without damaging the components of the display panel DP).

The display panel DP may include a plurality of pixels PX, a plurality of scan lines SL1 to SLm, a plurality of data lines DL1 to DLn, a plurality of emission lines EU to ELm, first and second control lines CSL1 and CSL2, a power line PL, and a plurality of pads PD. According to some embodiments, each of "m" and "n" may be a natural number. The pixels PX may be connected to the scan lines SL1 to SLm, the data lines DL1 to DLn, and the emission lines EL1 to ELm.

The scan lines SL1 to SLm may extend in the first direction DR1 and may be connected to the scan driver SDV. The data lines DL1 to DLn may extend in the second direction DR2 and may be connected to the driving chip DIC via the bending area BA. The emission lines EL1 to ELm may extend in the first direction DR1 and may be connected to the emission driver EDV.

A portion extending in the second direction DR2 of the power line PL may extend toward the second area AA2 via the bending area BA. The power line PL may supply a first voltage to the pixels PX. The first control line CSL1 may be connected to the scan driver SDV and may extend toward a lower end of the second area AA2 via the bending area BA. The second control line CSL2 may be connected to the emission driver EDV and may extend toward the lower end of the second area AA2 via the bending area BA.

When viewed in a plane, the pads PD may be located adjacent to the lower end of the second area AA2. The driving chip DIC, the power line PL, the first control line CSL1, and the second control line CSL2 may be connected to the pads PD. A flexible circuit film FCB may be electrically connected to the pads PD via an anisotropic conductive adhesive layer.

FIG. 2B shows a structure in which the driving chip DIC is mounted on the display panel DP, however, embodiments according to the present disclosure are not limited thereto or thereby. For example, the driving chip DIC may be mounted on the flexible circuit film FCB.

Figure 3A:
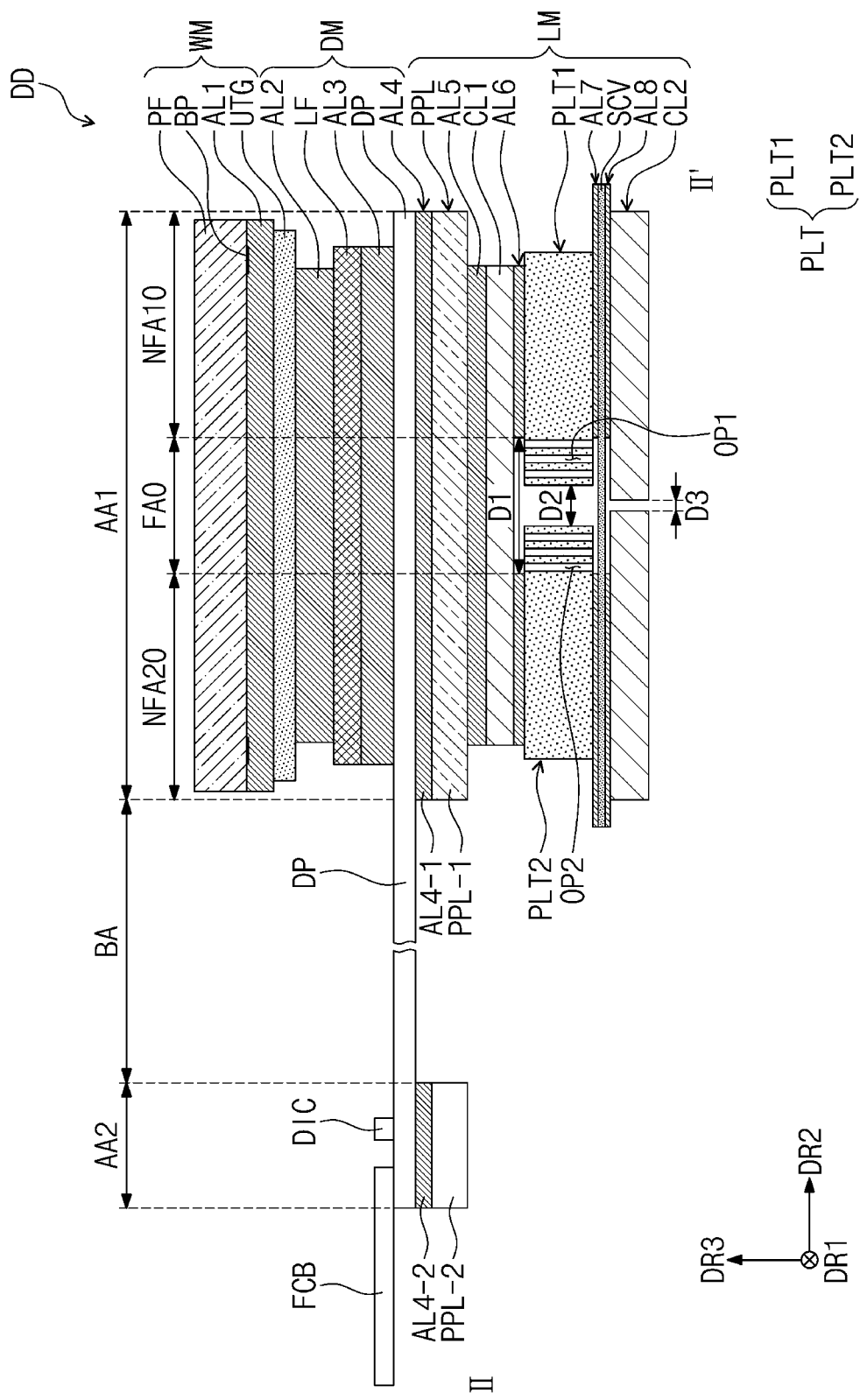
FIG. 3A is a cross-sectional view showing a display device according to some embodiments of the present disclosure.
Figure 3B:
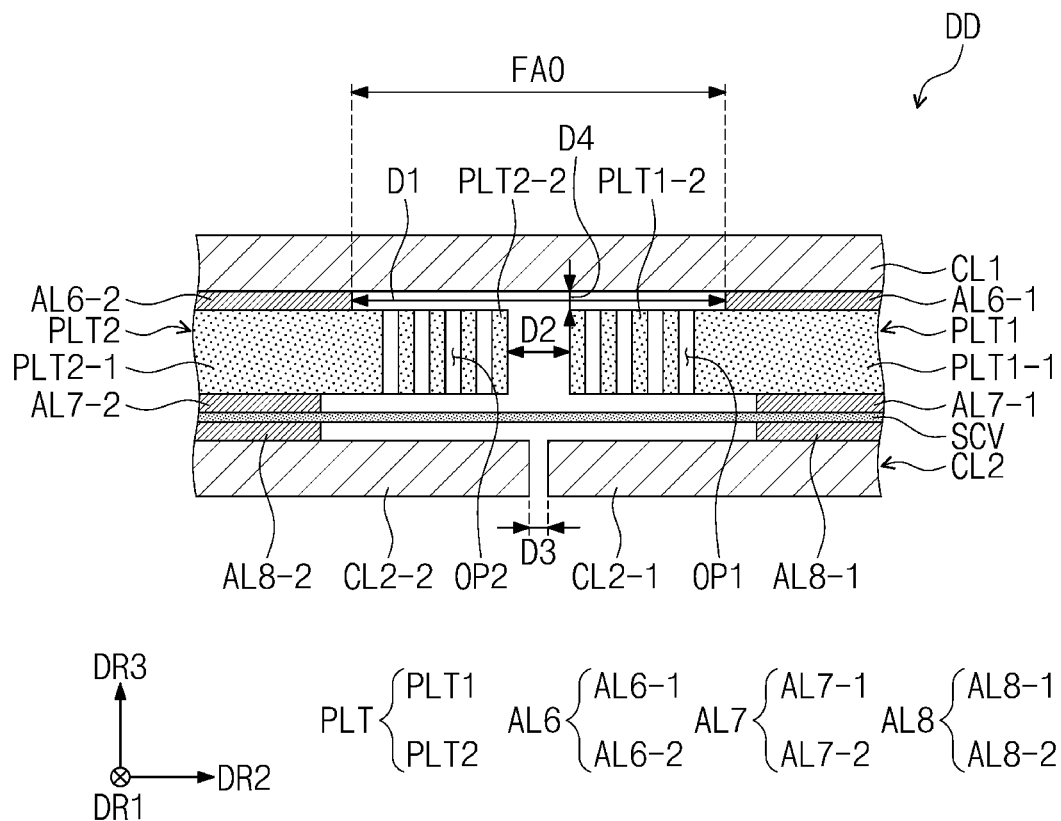
FIG. 3B is a cross-sectional view showing an unfolded state of a portion of a display device according to some embodiments of the present disclosure.
Figure 3C:
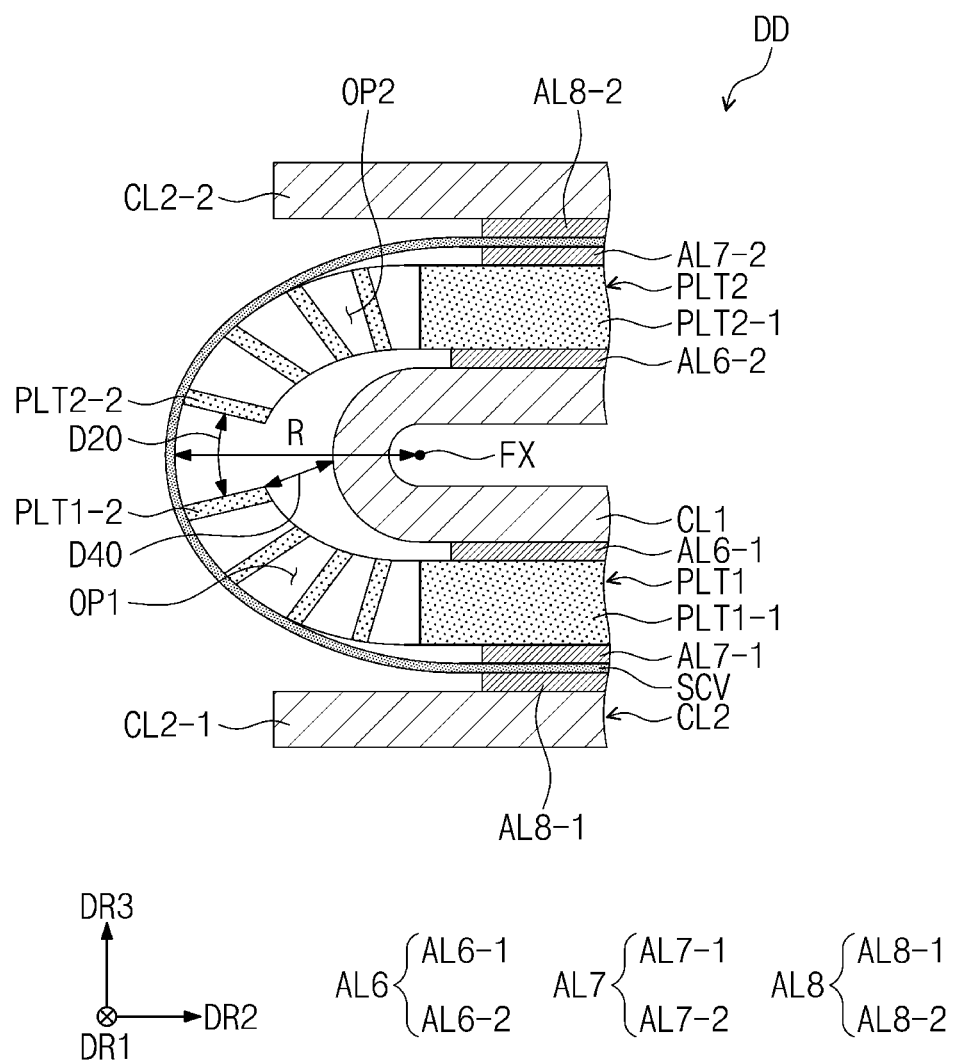
FIG. 3C is a cross-sectional view showing a folded state of a portion of a display device according to some embodiments of the present disclosure.

FIG. 3A is a cross-sectional view showing the display device DD according to some embodiments of the present disclosure. FIG. 3B is an enlarged cross-sectional view showing a portion of the display device DD in an unfolded state according to some embodiments of the present disclosure. FIG. 3C is an enlarged cross-sectional view showing a portion of the display device in a folded state according to some embodiments of the present disclosure. Hereinafter, the stack structure of the display device DD according to some embodiments of the present disclosure will be described in more detail with reference to FIGS. 3A and 3B.

Referring to FIGS. 3A and 3B, the display device DD may include the window module WM, the display module DM, and the lower member LM. In FIG. 3A, the input sensor IS (refer to FIG. 2A) is not shown.

Referring to FIG. 3A, the window module WM may include a thin glass substrate UTG, a window protective layer PF located on the thin glass substrate UTG, and a bezel pattern BP located on a lower surface of the window protective layer PF. According to some embodiments, the window protective layer PF may include a plastic film. Accordingly, the window module WM may further include an adhesive layer AL1 (hereinafter, referred to as a first adhesive layer) that attaches the plastic film to the thin glass substrate UTG. The bezel pattern BP may overlap the non-display area DP-NDA (refer to FIG. 2B). The bezel pattern BP may be located on one surface of the thin glass substrate UTG or one surface of the window protective layer PF. In FIG. 3A, the bezel pattern BP is located on the lower surface of the window protective layer PF, however, embodiments according to the present disclosure are not limited thereto or thereby. According to some embodiments, the bezel pattern BP may be located on an upper surface of the window protective layer PF. The bezel pattern BP may be a colored light blocking layer and may be formed by a coating or depositing process. The bezel pattern BP may include a base material and a pigment or a dye mixed with the base material.

The thin glass substrate UTG may have a thickness in a range from about 15 μm to about 45 μm. The thin glass substrate UTG may be a chemically strengthened glass. The occurrence of crease in thin glass substrate UTG may be minimized or reduced even after the folding and unfolding operations may be repeatedly performed.

The window protective layer PF may have a thickness in a range from about 50 μm to about 80 μm. The window protective layer PF may include polyimide, polycarbonate, polyamide, triacetylcellulose, polymethylmethacrylate, or polyethylene terephthalate. According to some embodiments, at least one of a hard coating layer, an anti-fingerprint layer, or an anti-reflective layer may be located on the upper surface of the window protective layer PF.

The first adhesive layer AL1 may be a pressure sensitive adhesive (PSA) film or an optically clear adhesive (OCA). As describe below, the display device DD may further include second, third, fourth, fifth, sixth, seventh, and eighth adhesive layers AL2, AL3, AL4, AL5, AL6, AL7, and AL8, and each of the second to eighth adhesive layers AL2 to AL8 may be the pressure sensitive adhesive (PSA) film or the optically clear adhesive (OCA) and may include a conventional adhesive.

The first adhesive layer AL1 may be separated from the thin glass substrate UTG. Because a strength of the window protective layer PF is lower than that of the thin glass substrate UTG, scratches may occur relatively easily. After the first adhesive layer AL1 and the window protective layer PF are separated from each other, another window protective layer PF may be attached to the thin glass substrate UTG.

The display module DM is located under the window module WM. The display module DM may include the anti-reflective layer LF and the display panel DP. Because the display panel DP has been described with reference to FIGS. 2A and 2B, some additional details of the display panel DP may be omitted.

The anti-reflective layer LF may be located in the first area AA1 as shown in FIG. 3A. The anti-reflective layer LF may cover at least the display area DP-DA (refer to FIG. 2B). The second adhesive layer AL2 may attach the anti-reflective layer LF to the window module WM, and the third adhesive layer AL3 may attach the anti-reflective layer LF to the display panel DP.

The lower member LM may be located under the display module DM. The lower member LM may include a panel protective layer PPL, a first cushion layer CL1, a support layer PLT, a cover layer SCV, and a second cushion layer CL2. According to some embodiments, some of the above-mentioned components may be omitted or the lower member LM may further include other components. For instance, the second cushion layer CL2 may be omitted. The display device DD may further include a heat dissipation layer.

The panel protective layer PPL may be located under the display panel DP to be closest to the display panel DP. The panel protective layer PPL may protect a lower portion of the display panel DP. The panel protective layer PPL may include a flexible plastic material. For example, the panel protective layer PPL may include polyethylene terephthalate. According to some embodiments, the panel protective layer PPL may not be located in the folding area FA0.

According to some embodiments, the panel protective layer PPL may include a first panel protective layer PPL-1 protecting the first area AA1 of the display panel DP and a second panel protective layer PPL-2 protecting the second area AA2 of the display panel DP.

The fourth adhesive layer AL4 may attach the panel protective layer PPL to the display panel DP. The fourth adhesive layer AL4 may include a first portion AL4-1 corresponding to the first panel protective layer PPL-1 and a second portion AL4-2 corresponding to the second panel protective layer PPL-2. When the bending area BA is bent, the second panel protective layer PPL-2 may be located under the first panel protective layer PPL-1 with the second area AA2. Because the panel protective layer PPL is not located in the bending area BA, the bending area BA may be more easily bent. The bending area BA may have a curvature (e.g., a set or predetermined curvature) and a curvature radius (e.g., a set or predetermined curvature radius). The curvature radius may be within a range from about 0.1 mm to about 0.5 mm.

The fifth adhesive layer AL5 may attach the panel protective layer PPL to the first cushion layer CL1. The first cushion layer CL1 may be located under the panel protective layer PPL.

The first cushion layer CL1 may absorb the external impact applied to the display panel DP and may prevent the display panel DP from being damaged. The first cushion layer CL1 may be a layer having an elasticity (e.g., a set or predetermined elasticity) and may include a foam resin, a sponge, or a polyurethane. The first cushion layer CL1 may have a color such that components located under the first cushion layer CL1 are not viewed to the user when the display device DD is viewed from a top of the window module WM. The first cushion layer CL1 may include a material that absorbs the light.

The sixth adhesive layer AL6 may attach a lower surface of the first cushion layer CL1 to an upper surface of the support layer PLT. As shown in FIG. 3B, the sixth adhesive layer AL6 may include a first portion AL6-1 and a second portion AL6-2 spaced apart from the first portion AL6-1. A distance D1 (hereinafter, referred to as a first distance) between the first portion AL6-1 and the second portion AL6-2 may correspond to a width of the folding area FA0. The first distance D1 may be within a range from about 7 mm to about 15 mm, or for example (or preferably according to some embodiments), a range from about 9 mm to about 13 mm.

As the sixth adhesive layer AL6 does not overlap a portion of the support layer PLT, the support layer PLT may not be attached to the first cushion layer CL1 by the first distance D1. Accordingly, the stress of the support layer PLT, which is generated in the folded state shown in FIG. 3C, may not be transferred to the components above the first cushion layer CL1. Therefore, the stress applied to the folding area FA0 of the display module DM and the window module WM in the folded state may be reduced.

According to some embodiments, the first portion AL6-1 and the second portion AL6-2 of the sixth adhesive layer AL6 may be defined as different portions of one adhesive layer, however, they should not be limited thereto or thereby. When the first portion AL6-1 is defined as one adhesive layer, e.g., a first adhesive layer, the second portion AL6-2 may be defined as another adhesive layer, e.g., a second adhesive layer.

According to some embodiments, an intermediate layer located between the display panel DP and the support layer PLT includes the panel protective layer PPL and the first cushion layer CL1, however, the configuration of the intermediate layer should not be limited thereto or thereby. For example, a layer that is in contact with the sixth adhesive layer AL6 may operate as the first cushion layer CL1, however, embodiments according to the present disclosure are not be limited thereto or thereby. According to some embodiments, the display device DD may further include a plastic film located between the first cushion layer CL1 and the sixth adhesive layer AL6, and in this case, the plastic film may be in contact with the sixth adhesive layer AL6.

The support layer PLT may support components arranged above the support layer PLT and may maintain the unfolded state and the folded state of the display device DD. The support layer PLT may include a first support layer PLT1 and a second support layer PLT2.

As shown in FIG. 3B, the first support layer PLT1 and the second support layer PLT2 may be spaced apart from each other in the unfolded state of the display device DD. The first support layer PLT1 and the second support layer PLT2 are not necessarily spaced apart from each other, and a side surface of the first support layer PLT1 and a side surface of the second support layer PLT2 may be in contact with each other. The first support layer PLT1 and the second support layer PLT2 may be arranged to be spaced apart from each other by a distance (e.g., a set or predetermined distance) D2 (hereinafter, referred to as a second distance) in consideration of a process tolerance such that interference does not occur between the first support layer PLT1 and the second support layer PLT2 in the process of arranging the first support layer PLT1 and the second support layer PLT2 to be parallel to each other. The second distance D2 may be smaller than about 0.7 mm.

The first support layer PLT1 may include a first support portion PLT1-1 corresponding to the first non-folding area NFA10 and a first protective portion PLT1-2 extending from the first support portion PLT1-1. The first protective portion PLT1-2 may have an elastic modulus smaller than that of the first support portion PLT1-1.

A plurality of first openings OP1 corresponding to the folding area FA0 may be defined through the first protective portion PLT1-2 to decrease the elastic modulus. The second support layer PLT2 may include a second support portion PLT2-1 corresponding to the second non-folding area NFA20 and a second protective portion PLT2-2 extending from the second support portion PLT2-1. The second protective portion PLT2-2 may have an elastic modulus smaller than that of the second support portion PLT2-1. A plurality of second openings OP2 corresponding to the folding area FA0 may be defined through the second protective portion PLT2-2 to decrease the elastic modulus.

The first support layer PLT1 and the second support layer PLT2 may include an iron alloy material (e.g., stainless steel, SUS, etc.) or a nickel-iron alloy such as FeNi36 (e.g., Invar), however, they should not be limited thereto or thereby and may include a variety of metal materials. The first support portion PLT1-1 may have the elastic modulus greater than that of the first protective portion PLT1-2, and the second support portion PLT2-1 may have the elastic modulus greater than that of the second protective portion PLT2-2. Due to the first openings OP1 and the second openings OP2, the shape of the first protective portion PLT1-2 and the second protective portion PLT2-2 may be easily changed when compared with the first support portion PLT1-1 and the second support portion PLT2-1.

Although the first support portion PLT1-1 and the first protective portion PLT1-2 have an integral shape and include the same material, the shape of the first protective portion PLT1-2 through which the first openings OP1 are defined may be more easily changed. This is because the elastic modulus of the first protective portion PLT1-2 decreases as the first openings OP1 are formed.

The elastic modulus of the first protective portion PLT1-2 and the second protective portion PLT2-2 may be within a range from about 1 Gpa to about 30 Gpa. The elastic modulus of the first support portion PLT1-1 and the second support portion PLT2-1 may be within a range from about 100 Gpa to about 200 Gpa.

The seventh adhesive layer AL7 may attach the support layer PLT to the cover layer SCV, and the eighth adhesive layer AL8 may attach the cover layer SCV to the second cushion layer CL2. The cover layer SCV may be coupled with the first support layer PLT1 and the second support layer PLT2, may correspond to the first non-folding area NFA10, the second non-folding area NFA20, and the folding area FA0, and may cover the first and second openings OP1 and OP2 defined through the support layer PLT.

The cover layer SCV may have an elastic modulus smaller than that of the first and second protective portions PLT1-2 and PLT2-2 of the support layer PLT. The cover layer SCV may have a thickness equal to or smaller than about 100 um, the elastic modulus equal to or smaller than about 100 MPa, and an elongation rate equal to or greater than about 100%. For example, the cover layer SCV may have the same structure as that of a mesh filter. As an example, the cover layer SCV may include a plastic film. The cover layer SCV may include thermoplastic polyurethane, rubber, or silicone, however, it should not be limited thereto or thereby.

The cover layer SCV may be attached to the support layer PLT. Although a separation space between the first support layer PLT1 and the second support layer PLT2 increases due to the folding operation as the folded state shown in FIG. 3C, the cover layer SCV may prevent or reduce instances of foreign substances entering through the increased separation space.

The seventh adhesive layer AL7 may include a first portion AL7-1 and a second portion AL7-2 spaced apart from the first portion AL7-1. A distance between the first portion AL7-1 and the second portion AL7-2 of the seventh adhesive layer AL7 may correspond to the first distance D1. The distance between the first portion AL7-1 and the second portion AL7-2 of the seventh adhesive layer AL7 may be greater than the first distance D1.

The second cushion layer CL2 may include the same material as the first cushion layer CL1. The second cushion layer CL2 may include a first portion CL2-1 and a second portion CL2-2 spaced apart from the first portion CL2-1. A distance D3 (hereinafter, referred to as a third distance) between the first portion CL2-1 and the second portion CL2-2 may be smaller than the first distance D1 and the second distance D2. The third distance D3 may be equal to or smaller than about 100 micrometers. According to some embodiments, a side surface of the first portion CL2-1 and a side surface of the second portion CL2-2 are in contact with each other, however, the first portion CL2-1 may be spaced apart from the second portion CL2-2 within a range of process tolerance. Because the second cushion layer CL2 has the elastic modulus lower than that of the support layer PLT, no significant stress occurs even though interference occurs between the second cushion layer CL2 and the support layer PLT. Accordingly, the third distance D3 may be set to be smaller than the second distance D2.

The eighth adhesive layer AL8 may include a first portion AL8-1 and a second portion AL8-2 spaced apart from the first portion AL8-1. The first portion AL8-1 of the eighth adhesive layer AL8 may attach the first portion CL2-1 of the second cushion layer CL2 to the cover layer SCV, and the second portion AL8-2 of the eighth adhesive layer AL8 may attach the second portion CL2-2 of the second cushion layer CL2 to the cover layer SCV. A distance between the first portion AL8-1 and the second portion AL8-2 of the eighth adhesive layer AL8 may correspond to the distance between the first portion AL7-1 and the second portion AL7-2 of the seventh adhesive layer AL7. According to some embodiments, an additional component, such as a metal plate, may be further arranged under the second cushion layer CL2.

Hereinafter, changes between the components, which occur as the shape of the display device DD is changed from the unfolded state to the folded state, will be described in more detail with reference to FIGS. 3B and 3C. The first protective portion PLT1-2 will be mainly described in order to avoid redundancy.

As shown in FIG. 3B, the first protective portion PLT1-2 and the first cushion layer CL1 may be spaced apart from each other by a fourth distance D4 in the unfolded state. The fourth distance D4 may be measured at one end of the first protective portion PLT1-2. The distance between the first protective portion PLT1-2 and the first cushion layer CL1 may be substantially constant.

As shown in FIG. 3C, the fourth distance D4 may increase as the shape of the display device DD is changed from the unfolded state to the folded state. The second distance D2 may also increase as the shape of the display device DD is changed from the unfolded state to the folded state. The fourth distance D40 obtained after the shape of the display device DD is changed and the second distance D20 obtained after the shape of the display device DD is changed are shown in FIG. 3C. The fourth distance D40 obtained after the shape of the display device DD is changed may be measured at the same position as the position at which the fourth distance D4 obtained before the shape of the display device DD is changed, i.e., at the one end of the first protective portion PLT1-2.

In the folded state, the fourth distance D40 between the first protective portion PLT1-2 and the first cushion layer CL1 may be changed depending on areas where the fourth distance D40 is measured. This is because the curvature of the bent first protective portion PLT1-2 is changed depending on the areas. The fourth distance D40 may increase as a distance from an edge of the first protective portion PLT1-2 decreases, i.e., as a distance from the first support portion PLT1-1 increases.

In the folded state, the cover layer SCV may have a maximum curvature radius R with respect to the folding axis FX. A sum W of a width of the first protective portion PLT1-2 and a width of the second protective portion PLT2-2 satisfies the following Equation 1. That is, the sum W of the width of the first protective portion PLT1-2 and the width of the second protective portion PLT2-2 may be smaller than a half of a length of a circumference of a circle with the maximum curvature radius R.

$$W < \pi \times R \qquad \text{Equation 1}$$

The cover layer SCV may be elongated as the shape of the display device DD is changed from the unfolded state to the folded state. The cover layer SCV elongated as the shape of the display device DD is changed may be in contact with portions of the first protective portion PLT1-2 and the second protective portion PLT2-2, which are arranged closer to the folding axis FX. This is because the cover layer SCV is deformed in a direction in which the cover layer SCV is relatively less deformed due to a restoring force even though the cover layer SCV is elongated as the shape of the display device DD is changed. The cover layer SCV may apply a compressive stress to the first protective portion PLT1-2 and the second protective portion PLT2-2 such that the first protective portion PLT1-2 and the second protective portion PLT2-2 spaced apart from the first protective portion PLT1-2 form the curvature (e.g. a set or predetermined curvature). In a case where the first protective portion PLT1-2 and the second protective portion PLT2-2 have a large elastic modulus, the first protective portion PLT1-2 and the second protective portion PLT2-2 may tend to be placed at the same line as the first support portion PLT1-1 and the second support portion PLT2-1 as shown in FIG. 3B regardless of the change in shape of the display device DD.

In other words, in a case where the first openings OP1 and the second openings OP2 are not formed, the first protective portion PLT1-2 and the second protective portion PLT2-2, which tend to be unfolded, and the cover layer SCV, which tends to deform the first protective portion PLT1-2 and the second protective portion PLT2-2, may apply conflicting stresses to each other. In this case, the stresses may be concentrated on portions at which ends of the first protective portion PLT1-2 and the second protective portion PLT2-2 are in contact with the cover layer SCV, and this may lead to the tearing of the cover layer SCV.

However, according to some embodiments, the first protective portion PLT1-2 and the second protective portion PLT2-2 with the small elastic modulus may be relatively easily changed to have the shape with the curvature (e.g., the set or predetermined curvature). As the first openings OP1 and the second openings OP2 are formed, the shape of the first protective portion PLT1-2 and the second protective portion PLT2-2 with the small elastic modulus may be easily changed by only the compressive stress applied thereto by the cover layer SCV.

When comparing with the case that the first protective portion PLT1-2 and the second protective portion PLT2-2 are not deformed, the cover layer SCV is less elongated and receives less stress from the first protective portion PLT1-2 and the second protective portion PLT2-2. Accordingly, the tearing of the cover layer SCV due to the first protective portion PLT1-2 and the second protective portion PLT2-2 may be prevented.

Figure 4A:
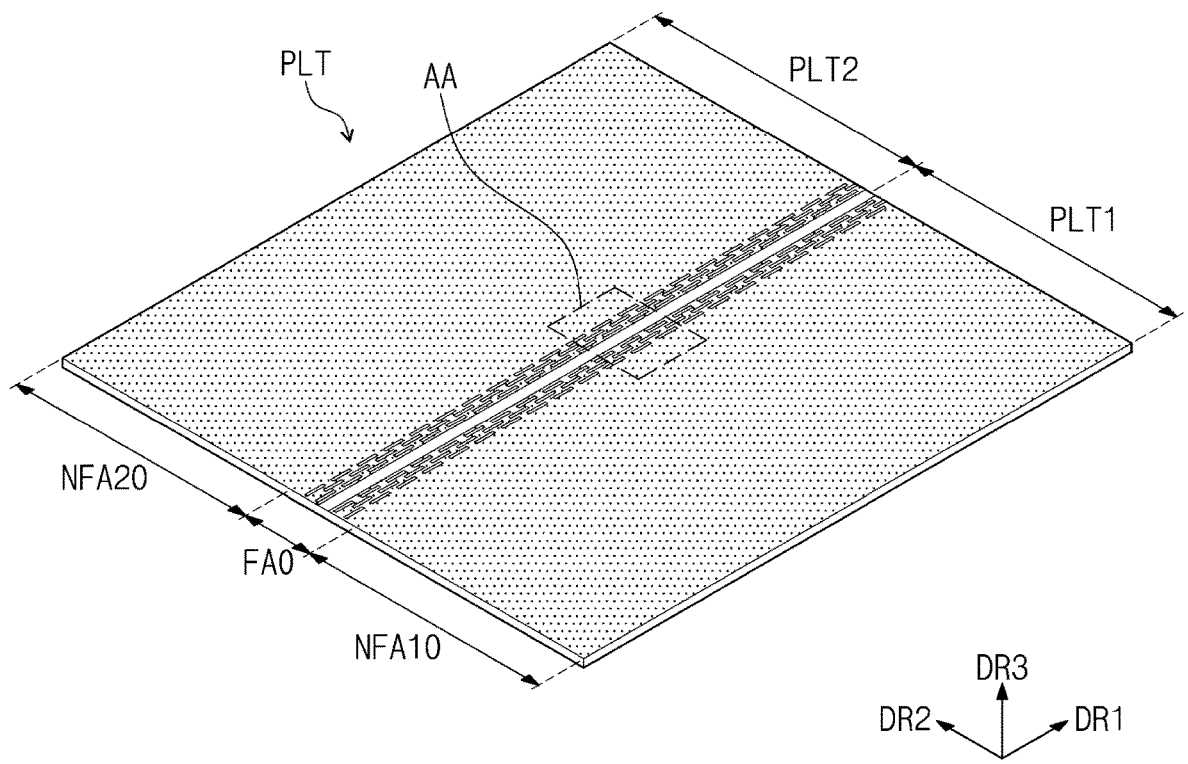
FIG. 4A is a perspective view showing a support layer according to some embodiments of the present disclosure.
Figure 4B:
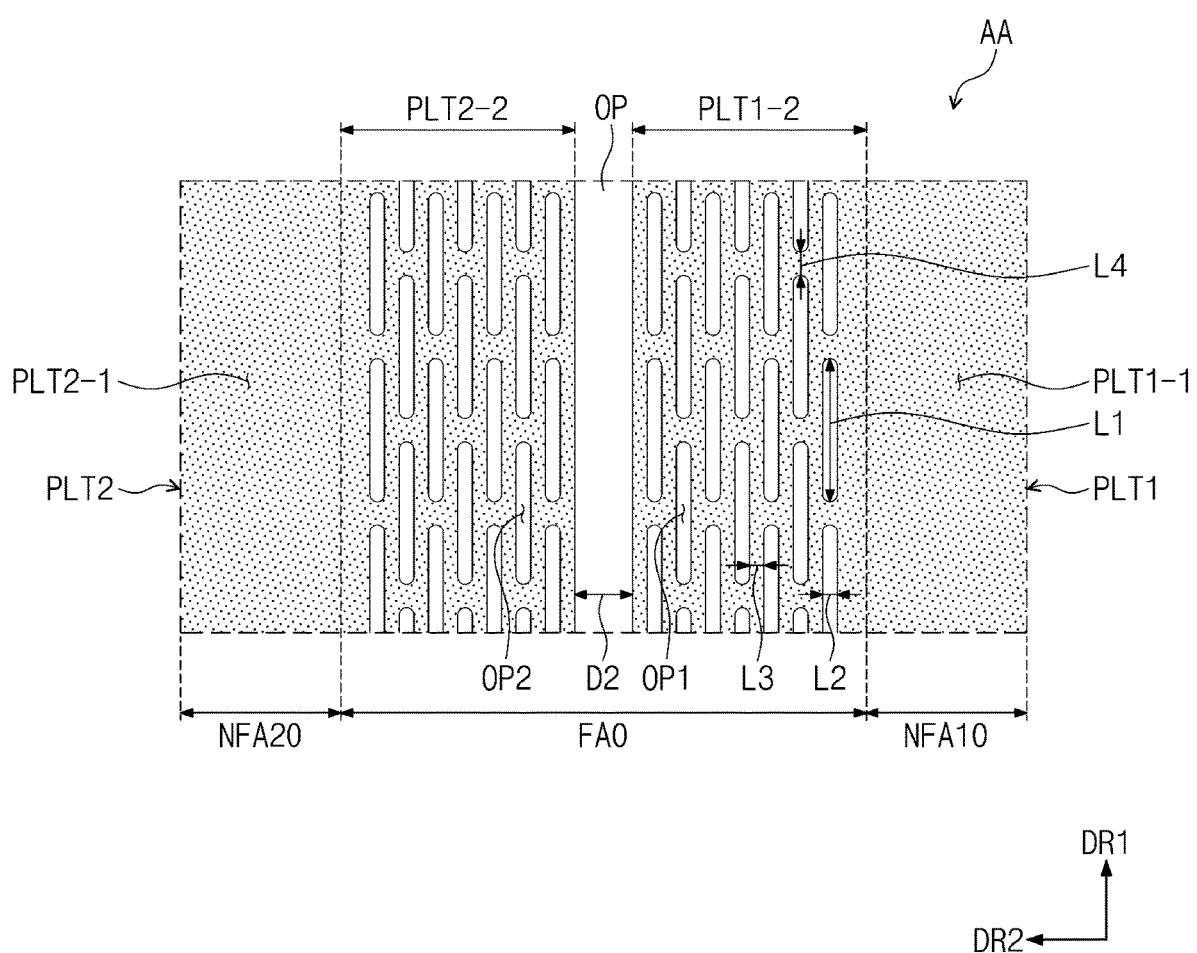
FIG. 4B is an enlarged plan view showing a portion of FIG. 4A.
Figure 4C:
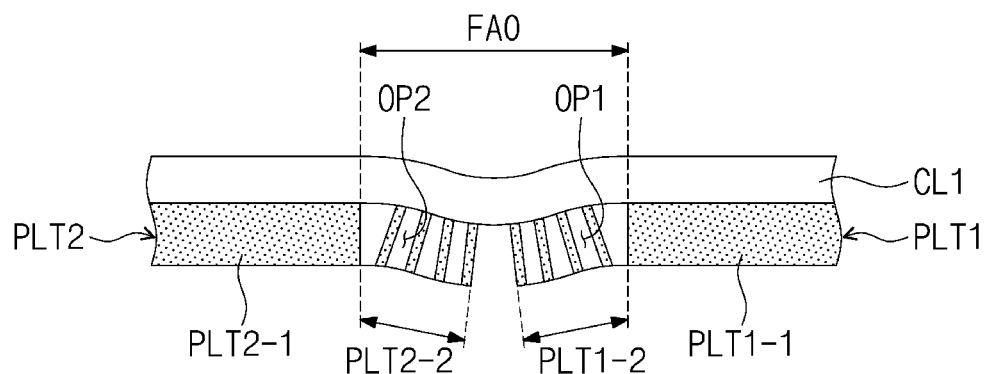
FIG. 4C is a cross-sectional view showing a display device according to some embodiments of the present disclosure.
Figure 4D:
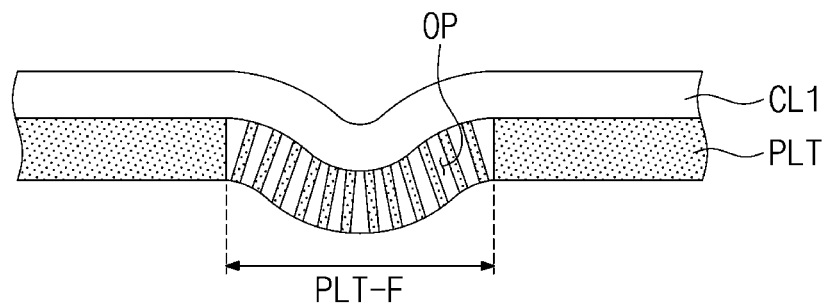
FIG. 4D is a cross-sectional view showing a display device according to a comparison example.

FIG. 4A is a perspective view showing the support layer PLT according to some embodiments of the present disclosure. FIG. 4B is an enlarged plan view showing a portion AA of FIG. 4A. FIG. 4C is a cross-sectional view showing a display device according to some embodiments of the present disclosure. FIG. 4D is a cross-sectional view showing a display device according to a comparison example. In FIGS. 4A to 4D, detailed descriptions of the same elements as those described with reference to FIGS. 1 to 3C will be omitted.

Referring to FIGS. 4A and 4B, the first openings OP1 and the second openings OP2 may be respectively formed through the first protective portion PLT1-2 and the second protective portion PLT2-2. Each of the first openings OP1 and the second openings OP2 may be arranged in a grid shape or a lattice shape. Because values described below and related to the first protective portion PLT1-2 and the second protective portion PLT2-2 are substantially the same as each other, the first protective portion PLT1-2 will be mainly described as a representative example.

A length in the first direction DR1 of each of the first openings OP1 is defined as a first length L1, a width in the second direction DR2 of each of the first openings OP1 is defined as a second length L2, a distance between the first openings OP1 adjacent to each other in the second direction DR2 is defined as a third length L3, and a distance between the first openings OP1 adjacent to each other in the first direction DR1 is defined as a fourth length L4. As shown in FIG. 4B, when the fourth length L4 is not uniform due to the first openings OP1 including a curve, a minimum distance between the first openings OP1 adjacent to each other in the first direction DR1 is defined as the fourth length L4.

As described above, the elastic modulus of the first protective portion PLT1-2 may be within a range from about 1 Gpa to about 30 Gpa, and the elastic modulus of the first protective portion PLT1-2 may be determined according to design values of the first openings OP1. As the first openings OP1 and the second openings OP2 are respectively arranged in the first protective portion PLT1-2 and the second protective portion PLT2-2 in the same arrangement, the first protective portion PLT1-2 and the second protective portion PLT2-2 may have substantially the same elastic modulus as each other.

Table 1 below shows elastic moduli of first protective portions PLT1-2 according to one comparison example and four embodiment examples. The elastic moduli of Table 1 below are simulated values.

TABLE 1

|  | Comparison example | First embodiment example | Second embodiment example | Third embodiment example | Fourth embodiment example |
| --- | --- | --- | --- | --- | --- |
| First length (L1) | 4 mm | 1 mm | 1 mm | 0.5 mm | 0.5 mm |
| Second length (L2) | 0.2 mm | 0.2 mm | 0.15 mm | 0.2 mm | 0.15 mm |
| Third length (L3) | 0.1 mm | 0.1 mm | 0.15 mm | 0.1 mm | 0.15 mm |
| Fourth length (L4) | 0.15 mm | 0.15 mm | 0.15 mm | 0.15 mm | 0.15 mm |
| Elastic modulus | 3.95 MPa | About 1 GPa | About 3 GPa | About 8 GPa to about 9 GPa | About 25 GPa to about 30 GPa |

FIGS. 4C and 4D show only the first cushion layer CL1 as the upper member, however, descriptions below may be applied to the display panel DP (refer to FIG. 3A) and the window module WM (refer to FIG. 3A).

Referring to FIG. 4C, according to some embodiments, although the folding operation and the unfolding operation are repeated, the first protective portion PLT1-2 and the second protective portion PLT2-2 may sufficiently support the first cushion layer CL1 such that the crease is not generated in the first cushion layer CL1. This is because the elastic modulus of the first protective portion PLT1-2 and the second protective portion PLT2-2 is within a range from about 1 Gpa to about 30 Gpa that is greater than that of the comparison example described below.

Referring to FIG. 4D, a support layer PLT according to the comparison example includes an integrated protective portion PLT-F overlapping a folding area FA0. The integrated protective portion PLT-F may be provided with a plurality of openings OP defined therethrough. The openings OP may be designed such that an elastic modulus of the integrated protective portion PLT-F has several tens of MPa. This is because the protective portion PLT-F needs to be designed to have a sufficiently low elastic modulus such that the integrated protective portion PLT-F is not cracked even though the folding operation and the unfolding operation are repeated.

However, referring to FIG. 4D, creases may be generated in the integrated protective portion PLT-F after the folding operation and the unfolding operation are repeated several times. This is because the integrated protective portion PLT-F does not shrink as much as it is elongated after the integrated protective portion PLT-F is elongated. The creases of the integrated protective portion PLT-F are transferred to the upper member, and consequently, the creases are generated in the first cushion layer CL1.

Figure 5A:
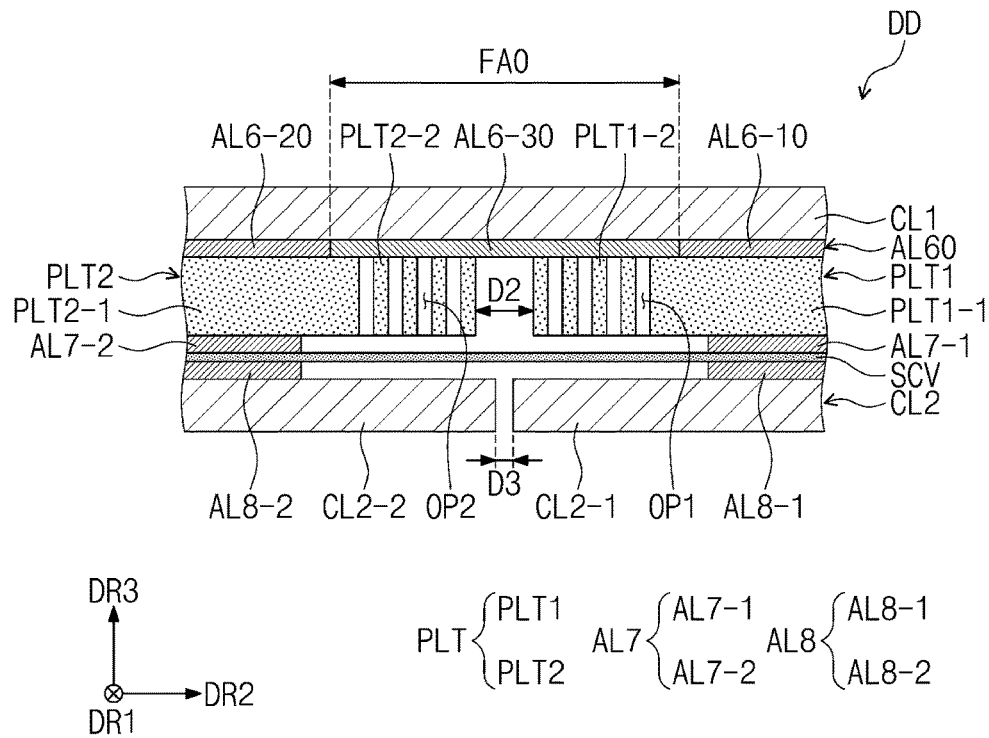
FIGS. 5A and 5B are enlarged cross-sectional views showing a portion of a display device according to some embodiments of the present disclosure.
Figure 5B:
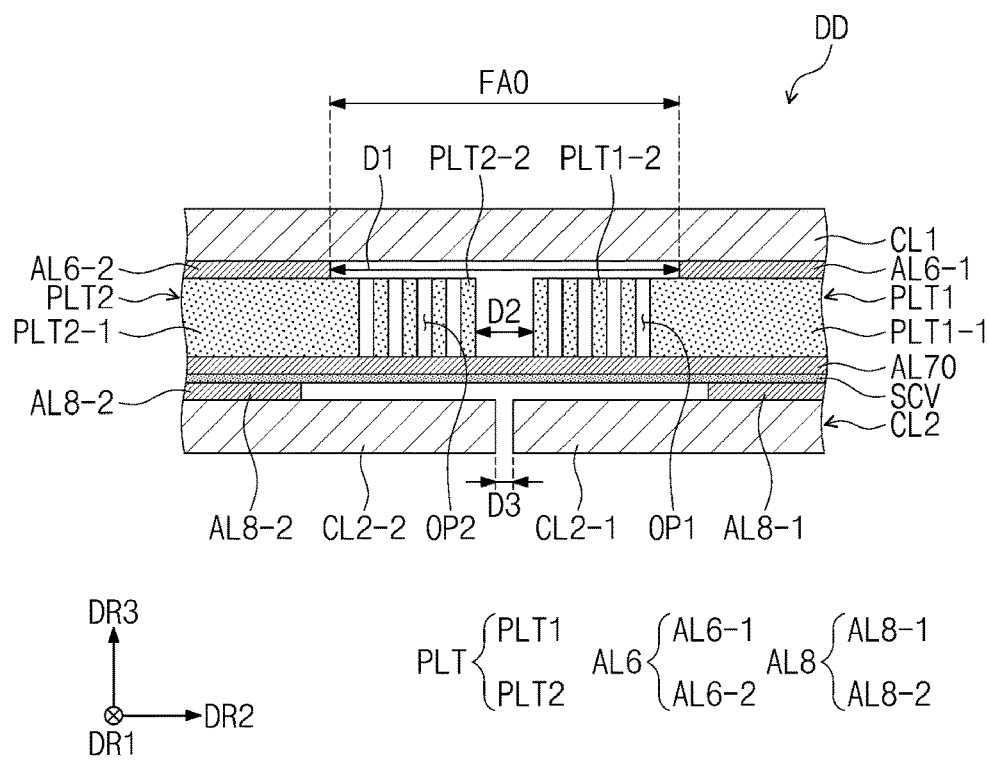

FIGS. 5A and 5B are enlarged cross-sectional views showing a portion of a display device DD according to some embodiments of the present disclosure. FIGS. 5A and 5B show a cross-section corresponding to FIG. 3B. Hereinafter, descriptions of the same elements as those described with reference to FIGS. 1 to 4D will be omitted.

Referring to FIG. 5A, a sixth adhesive layer AL60 may overlap a first protective portion PLT1-2 and a second protective portion PLT2-2. That is, the sixth adhesive layer AL60 may overlap a folding area FA0, a first non-folding area NFA10, and a second non-folding area NFA20 and may have an integral shape.

The sixth adhesive layer AL60 may include a first area AL6-10 attached to an upper surface of a first support portion PLT1-1, a second area AL6-20 attached to an upper surface of a second support portion PLT2-1, and a third area AL6-30 that overlaps an upper surface of the first protective portion PLT1-2 and an upper surface of the second protective portion PLT2-2 and is not attached to the upper surface of the first protective portion PLT1-2 and the upper surface of the second protective portion PLT2-2. The sixth adhesive layer AL60 may be attached to a first cushion layer CL1 after the third area AL6-30 of the sixth adhesive layer AL60 is cured. An adhesion of the cured third area AL6-30 may be removed.

Because the third area AL6-30 is not adhered to the first cushion layer CL1 even though the third area AL6-30 supports the first cushion layer CL1 in the folded state, stresses generated by the first protective portion PLT1-2 and the second protective portion PLT2-2 may not be transmitted to an upper side of the first cushion layer CL1. Accordingly, the stresses may be prevented from being applied to the display panel DP (refer to FIG. 3A) and the window module WM (refer to FIG. 3A) arranged on the first cushion layer CL1.

Referring to FIG. 5B, a seventh adhesive layer AL70 may overlap a first protective portion PLT1-2 and a second protective portion PLT2-2. That is, the seventh adhesive layer AL70 may have an integral shape overlapping a folding area FA0, a first non-folding area NFA10, and a second non-folding area NFA20.

Because an adhesive layer having a relatively small elastic modulus is applied to the seventh adhesive layer AL70, the seventh adhesive layer AL70 may be elongated and shrunk together with the cover layer SCV.

Figure 6A:
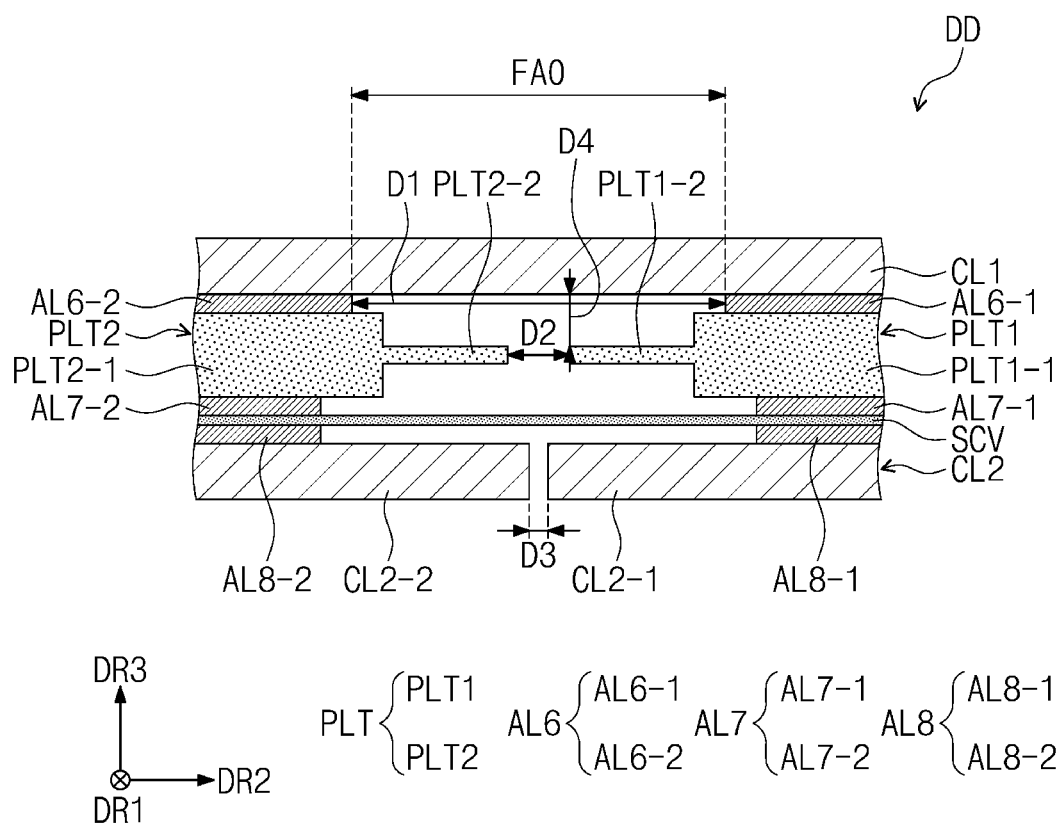
FIG. 6A is an enlarged cross-sectional view showing an unfolded state of a portion of a display device according to some embodiments of the present disclosure.
Figure 6B:
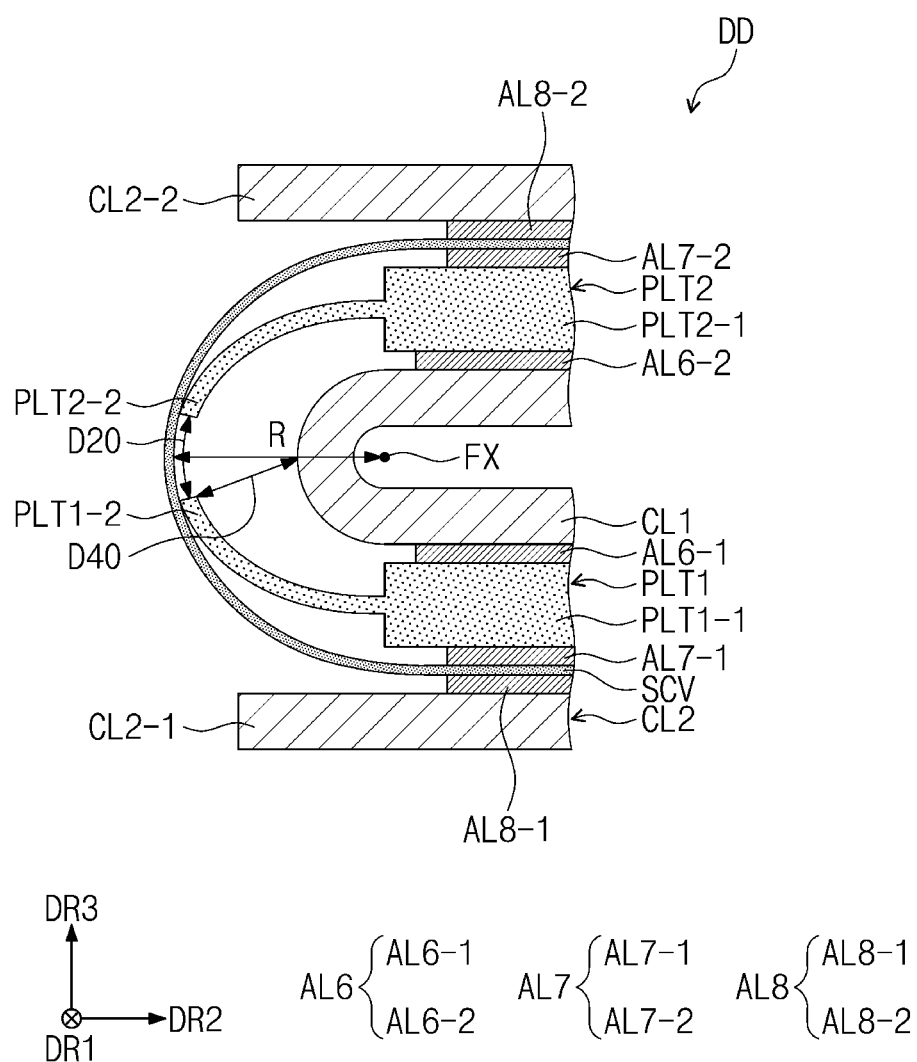
FIG. 6B is an enlarged cross-sectional view showing a folded state of a portion of a display device according to some embodiments of the present disclosure.
Figure 7A:
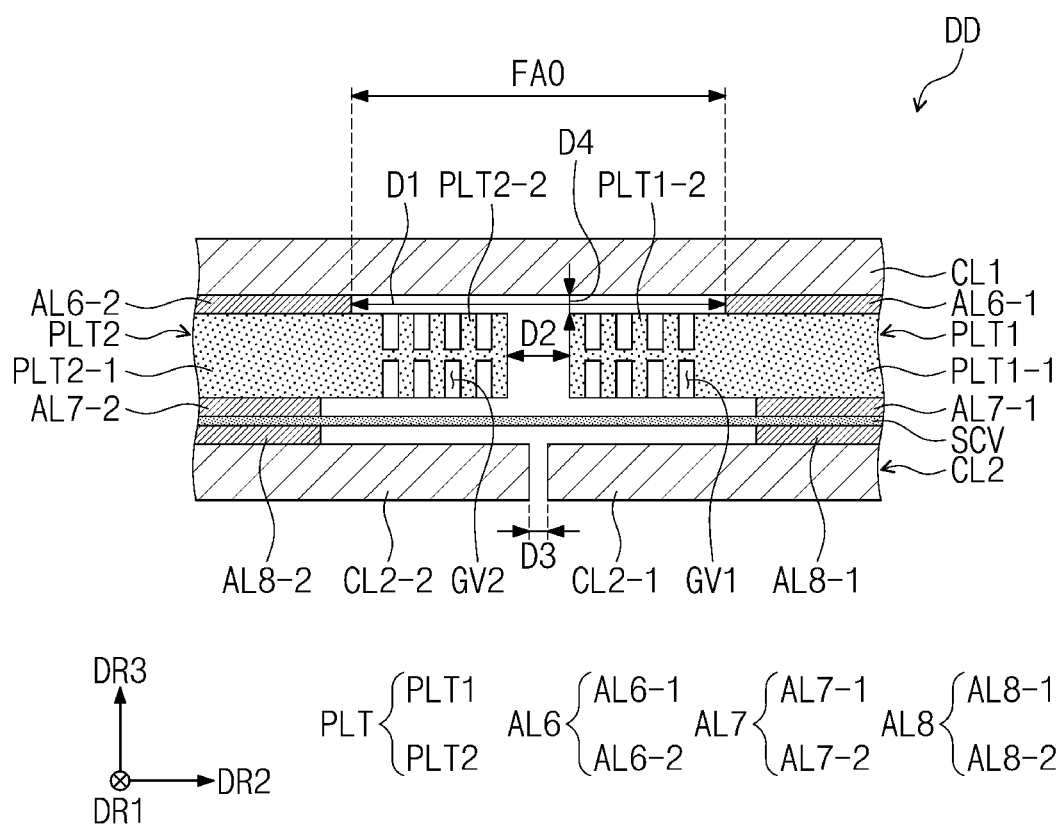
FIG. 7A is an enlarged cross-sectional view showing an unfolded state of a portion of a display device according to some embodiments of the present disclosure.
Figure 7B:
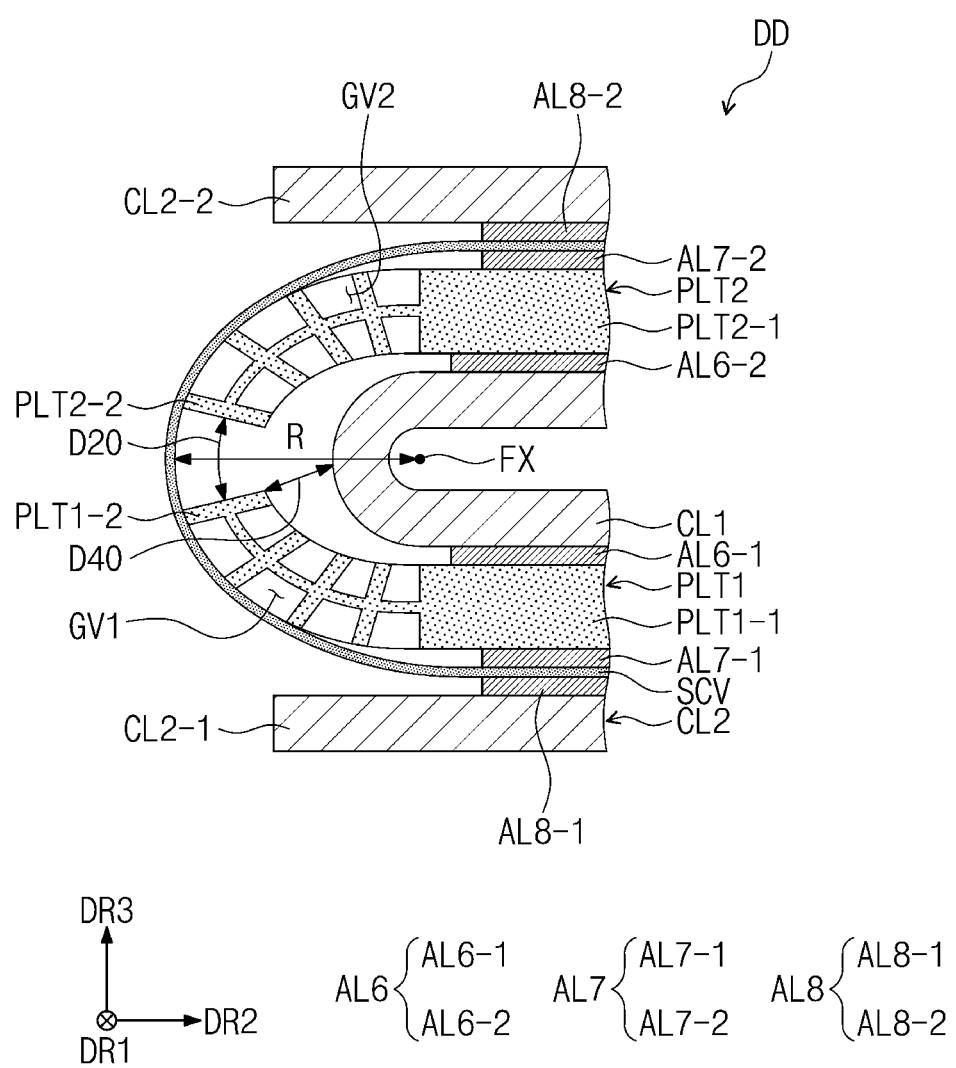
FIG. 7B is an enlarged cross-sectional view showing a folded state of a portion of a display device according to some embodiments of the present disclosure.

FIG. 6A is an enlarged cross-sectional view showing an unfolded state of a portion of a display device DD according to some embodiments of the present disclosure, and FIG. 6B is an enlarged cross-sectional view showing a folded state of the portion of the display device DD according to some embodiments of the present disclosure. FIG. 7A is an enlarged cross-sectional view showing an unfolded state of a portion of a display device DD according to some embodiments of the present disclosure, and FIG. 7B is an enlarged cross-sectional view showing a folded state of the portion of the display device DD according to some embodiments of the present disclosure. FIGS. 6A and 7A correspond to FIG. 3B, and FIGS. 6B and 7B correspond to FIG. 3C. Hereinafter, detailed descriptions of the same elements as those described with reference to FIGS. 1A to 5B will be omitted.

Referring to FIGS. 6A and 6B, a first support layer PLT1 may include a first support portion PLT1-1 corresponding to a first non-folding area NFA10 and a first protective portion PLT1-2 extending from the first support portion PLT1-1. The first protective portion PLT1-2 may have a thickness smaller than that of the first support portion PLT1-1 to have an elastic modulus smaller than that of the first support portion PLT1-1. The second support layer PLT2 may include a second support portion PLT2-1 corresponding to a second non-folding area NFA20 and a second protective portion PLT2-2 extending from the second support portion PLT2-1. The second protective portion PLT2-2 may have a thickness smaller than that of the second support portion PLT2-1 to have an elastic modulus smaller than that of the second support portion PLT2-1.

Hereinafter, the first support layer PLT1 will be mainly described. The first support layer PLT1 in which a step difference is defined between an upper surface of the first support portion PLT1-1 and an upper surface of the first protective portion PLT1-2 and a step difference is defined between a lower surface of the first support portion PLT1-1 and a lower surface of the first protective portion PLT1-2 is shown as an example. According to some embodiments, the step difference may be formed only in one of the upper surface and the lower surface to allow the first protective portion PLT1-2 to have the thickness smaller than that of the first support portion PLT1-1. According to some embodiments, a filling layer, e.g., a plastic layer, may be further arranged to overlap the first support portion PLT1-1 to reduce the step difference. The filling layer may have an elastic modulus smaller than that of the first support portion PLT1-1.

Referring to FIGS. 7A and 7B, a first support layer PLT1 may include a first support portion PLT1-1 corresponding to a first non-folding area NFA10 and a first protective portion PLT1-2 extending from the first support portion PLT1-1. A plurality of first grooves GV1 may be defined in the first protective portion PLT1-2, and thus, the first protective portion PLT1-2 may have an elastic modulus smaller than that of the first support portion PLT1-1. The second support layer PLT2 may include a second support portion PLT2-1 corresponding to a second non-folding area NFA20 and a second protective portion PLT2-2 extending from the second support portion PLT2-1. A plurality of second grooves GV2 may be defined in the second protective portion PLT2-2, and thus, the second protective portion PLT2-2 may have an elastic modulus smaller than that of the second support portion PLT2-1.

Hereinafter, the first support layer PLT1 will be mainly described. The first support layer PLT1 in which the first grooves GV1 are defined in an upper surface of the first protective portion PLT1-2 and a lower surface of the first protective portion PLT1-2 is shown as an example. The first grooves GV1 may be arranged in a grid shape or a lattice shape when viewed in a plane as same as shown in FIG. 4B. The arrangement of the first grooves GV1 defined in the upper surface of the first protective portion PLT1-2 may be different from the arrangement of the first grooves GV1 defined in the lower surface of the first protective portion PLT1-2.

According to some embodiments, the first grooves GV1 may be formed only in one of the upper surface and the lower surface of the first protective portion PLT1-2. According to some embodiments, a filling layer, e.g., a plastic layer, may be further arranged inside the first grooves GV1. The filling layer may have an elastic modulus smaller than that of the first support portion PLT1-1.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and their equivalents.

What is claimed is:

1. A display device comprising:
a display panel comprising a first non-folding area, a second non-folding area, and a folding area between the first non-folding area and the second non-folding area; and
a lower member under the display panel, the lower member comprising:
a first support layer comprising a first support portion corresponding to the first non-folding area and a first protective portion extending from the first support portion, corresponding to the folding area, and having an elastic modulus smaller than the first support portion;
a second support layer comprising a second support portion corresponding to the second non-folding area and a second protective portion extending from the second support portion, corresponding to the folding area, and having an elastic modulus smaller than the second support portion and disconnected and spaced apart from the first support layer in the folding area;
a cover layer under the first support layer and the second support layer, coupled with the first support layer and the second support layer, and corresponding to the first non-folding area, the second non-folding area, and the folding area;
a lower cushion layer under the cover layer, coupled to the cover layer, wherein the lower cushion layer comprises a first lower cushion layer and a second lower cushion layer such that the first lower cushion layer and the second lower cushion layer are spaced apart from each other by a distance,
wherein a side surface of the first protection portion and a side surface of the second protection portion most adjacent thereto are spaced apart by a first distance.

2. The display device of claim 1, wherein the first protective portion has a plurality of first openings, and the second protective portion has a plurality of second openings.

3. The display device of claim 2, wherein the first openings are arranged in a first grid shape or a first lattice shape in a plane, and the second openings are arranged in a second grid shape or a second lattice shape in a plane.

4. The display device of claim 1, wherein the first protective portion and the second protective portion have an elastic modulus within a range from about 1 GPa to about 30 GPa.

5. The display device of claim 1, wherein the first support portion and the second support portion have an elastic modulus within a range from about 100 GPa to about 200 GPa.

6. The display device of claim 1, wherein the first protective portion and the second protective portion have substantially a same elastic modulus.

7. The display device of claim 1, wherein the first protective portion and the first support portion are integrally formed with each other, and the second protective portion and the second support portion are integrally formed with each other.

8. The display device of claim 7, wherein the first support layer and the second support layer comprise a stainless steel or a nickel-iron alloy.

9. The display device of claim 1, wherein the first protective portion and the second protective portion are spaced apart from each other by the first distance in an unfolded state of the display device, and the first distance is equal to or smaller than 0.7 mm.

10. The display device of claim 9, wherein the first protective portion and the second protective portion are spaced apart from each other by a second distance greater than the first distance in a folded state of the display device.

11. The display device of claim 1, wherein the cover layer has a maximum curvature radius (R) with respect to a folding axis when the display device is folded about the folding axis, and a sum (W) of a width of the first protective portion and a width of the second protective portion satisfies $W < \pi \times R$.

12. The display device of claim 1, wherein the lower member further comprises:
a first adhesive layer attached to an upper surface of the first support portion; and
a second adhesive layer attached to an upper surface of the second support portion, and the first adhesive layer and the second adhesive layer are spaced apart from each other in a plane.

13. The display device of claim 12, wherein a distance between the first adhesive layer and the second adhesive layer in an unfolded state of the display device corresponds to a width of the folding area.

14. The display device of claim 12, wherein the lower member further comprises a cushion layer attached to an upper surface of the first adhesive layer and an upper surface of the second adhesive layer, and a distance between the first protective portion and the cushion layer increases as a distance from the first support portion increases in a folded state of the display device.

15. The display device of claim 1, wherein the lower member further comprises an adhesive layer attached to the first support portion and the second support portion, and the adhesive layer comprises a first area attached to an upper surface of the first support portion, a second area attached to an upper surface of the second support portion, and a third area overlapping an upper surface of the first protective portion and an upper surface of the second protective portion while not being attached to the upper surface of the first protective portion and the upper surface of the second protective portion.

16. The display device of claim 1, wherein the cover layer comprises a plastic film.

17. The display device of claim 1, wherein the lower member further comprises:
a panel protective layer between the display panel and the first support layer and between the display panel and the second support layer; and
a cushion layer between the panel protective layer and the first support layer and between the panel protective layer and the second support layer.

* * * * *